INVENTORS

YOSHITO OMURA and SHIKAYUKI OCHI

BY

Craig, Antonelli, Stewart & Hill ATTORNEYS

Dec. 15, 1970 YOSHITO OMURA ET AL 3,548,332

GAIN CONTROL CIRCUIT

Filed April 30, 1969 2 Sheets-Sheet 2

INVENTORS

YOSHITO OMURA and SHIKAYUKI OCHI

BY

Craig, Antonelli, Stewart & Hill ATTORNEYS

United States Patent Office 3,548,332

Patented Dec. 15, 1970

3,548,332

GAIN CONTROL CIRCUIT

Yoshito Omura, Hachioji-shi, and Shikayuki Ochi, Kokubunji-shi, Japan, assignors to Hitachi, Ltd., Tokyo-to, Japan Filed Apr. 30, 1969, Ser. No. 820,524

Claims priority, application Japan, Apr. 30, 1968, 43/28,585

Int. Cl. H03g 3/30

U.S. Cl. 330—29 7 Claims

ABSTRACT OF THE DISCLOSURE

A gain control circuit comprising a pair of transistors, the collector-emitter circuits of which are connected in series to each other and in parallel to an input signal source to form an alternating current path, a reference electric potential being supplied to the base of the one and a control signal voltage being supplied to the base of the other transistor, such that attenuation characteristics are obtained from one of the two transistors while the output impedances of said transistors are controlled almost fixedly.

This invention relates in general to a gain control circuit, and especially to a transistorized gain control circuit used for audio or video amplifiers.

Generally, the amplifying gain of a transistor amplifier can be controlled by varying the emitter current or the collector voltage. At the same time, however, desirable conditions of the circuit become different as the emitter current or the collector voltage varies even if the circuit is designed for a certain value of emitter current or collector voltage because the input and output impedances of the transistor vary. Therefore, there have been certain insufficiencies in the prior art such as distortion in transmission characteristics and discrepancies in pass band frequencies and center frequency. Also, there has been difficulty with distortion of the output signal when the input signal is large.

An object of the present invention is to provide a gain control circuit which is able to control gain without distortion of the output signal even for a relatively large level of input signal and also which is able to efficiently obtain a great change in the insertion loss.

Another object of the invention is to provide a gain control circuit which is able to control gain without causing any change in the band pass characteristics.

Still another object of the invention is to provide a gain control circuit suitable for semiconductor integrated circuits.

According to one embodiment of the invention, the attenuation characteristics are obtained from one of the two transistors, the collector-emitter circuits of which are connected in series to each other and in parallel to an input signal source to form an alternating current path, a reference electric potential being supplied to the base of the one and a control signal voltage being supplied to the base of the other transistor while the output impedances of said transistors are implementally controlled.

Other objects and characteristics of the present invention are explained in detail with reference to the following drawings, wherein.

Figure 1:
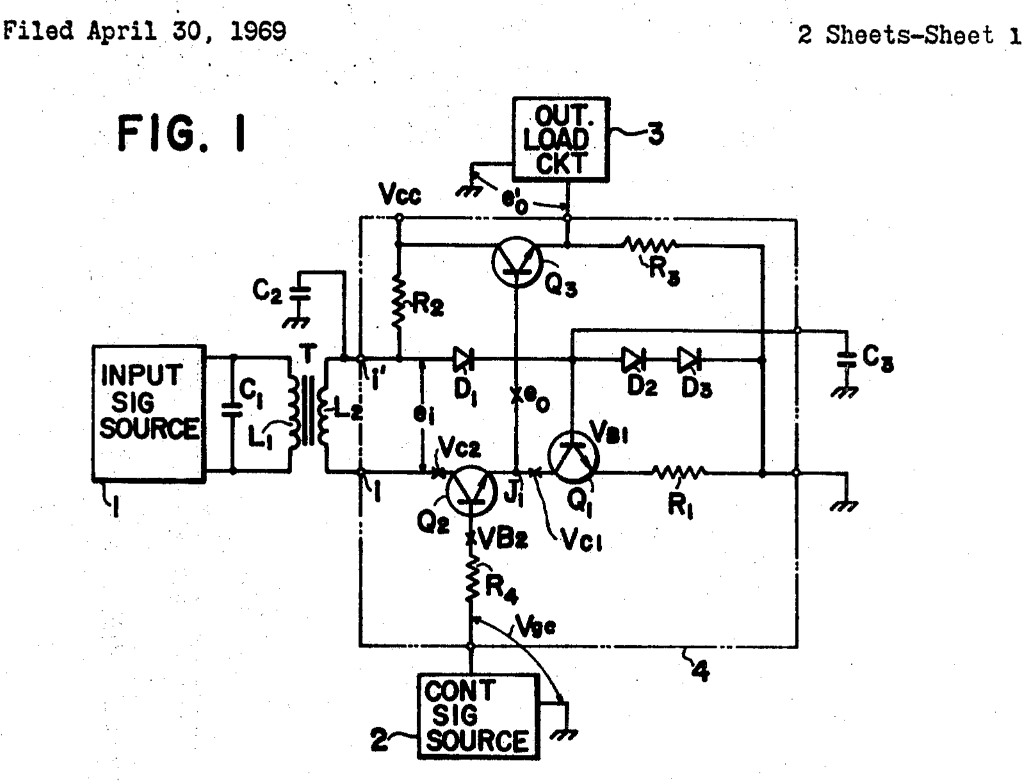
FIG. 1 shows a circuit diagram for a gain control circuit according to the invention.

FIG. 1 shows one example of a gain control circuit according to the present invention. In the figure, $Q_1$, $Q_2$ and $Q_3$ signify NPN-type silicon transistors; $D_1$, $D_2$ and $D_3$ are silicon diodes; $R_1$ signifies a bias resistance for the transistor $Q_1$; $R_2$ is a resistance for regulating the supply voltage; $R_3$ is a load resistance for the transistor $Q_3$ arranged in the emitter follower connection; $R_4$ is a resistance for regulating the input impedance, and $C_2$ and $C_3$ signify capacitors for bypassing alternating current signals. The circuit further includes an input signal source 1, a control signal source 2 for supplying the positive polarity control signal voltage $Vgc$, and an output load circuit 3. A transformer T has a primary winding $L_1$, a secondary winding $L_2$, and a resonance capacitor $C_1$ connected across the primary winding.

In the circuit according to the present invention, the transistors $Q_1$ and $Q_2$ are connected in series by connecting the collector of the transistor $Q_1$ to the emitter of the transistor $Q_2$, and the series circuit is connected across the secondary winding $L_2$ forming an A.C. circuit thereacross. The load circuit 3 is connected to an emitter follower amplifier composed of the transistor $Q_3$ and the resistance $R_3$ connected between voltage source $Vcc$ and ground. In addition, the base of the transistor $Q_3$ is connected to the connecting point $J_1$ of the transistors $Q_1$ and $Q_2$. The diodes $D_1$, $D_2$ and $D_3$ connected in series constitute a constant voltage circuit, and the electric power for the constant voltage circuit is supplied from the direct current source $Vcc$ through the resistance $R_2$. The said constant voltage circuit makes use of the fact that the threshold voltage or rising voltage in the forward direction of a silicon diode is only slightly changeable and is almost fixed with respect to the change in the impressed voltage in the forward direction of the same. In general, the threshold voltage is 0.70–0.75 in silicon diodes, and so a voltage of about 1.4–1.5 v. can be obtained across the circuit composed of the diodes $D_2$ and $D_3$ in series and that of about 0.7 v. can be obtained across the diode $D_1$. The voltage provided across the circuit of the diodes $D_2$ and $D_3$ in series is impressed between the base and emitter of the transistor $Q_1$ through the resistance $R_1$. Also, the voltage across the diode $D_1$ is impressed between the base of the transistor $Q_1$ and the collector of the transistor $Q_2$ through the secondary winding $L_2$. Thereby, the potential difference between the base potential $V_{B1}$ of the transistor $Q_1$ and the collector potential $V_{C2}$ of the transistor $Q_2$ is prescribed to less than 0.7 v. and the potential difference between the base potential and emitter potential of the transistor $Q_1$ is about 1.4 v. determined by the diodes $D_2$ and $D_3$.

In the following, the performance of the gain control circuit according to the present invention is explained in detail referring to FIG. 1. When the control voltage $Vgc$ from the control signal source 2 is higher than the collector potential $V_{C2}$ of the transistor $Q_2$, which is about 2.1 v., the transistor $Q_2$ operates in the saturation region and in the state of low impedance, for the base potential $V_{B2}$ of the transistor $Q_2$ is higher than the collector potential $V_{C2}$. Also, at this time, the base-emitter junction of the transistor $Q_2$ is forward biased, and the current flows via the PN-junction. The voltage drops about 0.7 v. across the said junction. Therefore, when the control signal voltage $Vgc$ is higher than 2.1 v., the emitter potential of the transistor $Q_2$, i.e. the collector potential $V_{C1}$ of the transistor $Q_1$, becomes higher than 1.4 v. On the other hand, since the base potential $V_{B1}$ of the transistor $Q_1$ is prescribed to 1.4 v. by the potential difference of both ends of the two diodes $D_2$ and $D_3$ connected in series, the transistor $Q_1$ operates in the active region and in the state of high impedance due to the base potential $V_{B1}$ being lower than the collector potential $V_{C1}$. When the control signal voltage $Vgc$ is equal to the collector potential $V_{C2}$ of the transistor $Q_2$, the base potential and collector potential of the transistor $Q_2$ become equal to each other, and the transistor $Q_2$ begins to operate in a boundary part of the saturation region and the active region and in the state of higher impedance than the preceding case. Meanwhile, the transistor $Q_1$ begins to operate in the saturation region and in the state of low impedance.

When the control signal voltage $Vgc$ becomes still lower, the transistor $Q_2$ operates in the active region and in the state of still higher impedance than the preceding case. On the other hand, the transistor $Q_1$ operates in the saturation region and in the state of still lower impedance than the preceding case. Thus, the transistors $Q_1$ and $Q_2$ operate with a characteristic extending over the active and saturation regions, the impedances $Z_{Q1}$ of the transistor $Q_1$ and $Z_{Q2}$ of the transistor $Q_2$ interchangeably increase and decrease, and the sum of said impedances is invariably controlled. The input signal voltage $e_i$ is divided by the impedances $Z_{Q1}$ and $Z_{Q2}$.

The relations of the output signal voltage $e_o$ at the junction $J_1$, the output signal voltage $e_o$ of the emitter follower circuit, and the input signal voltage $e_i$ are shown below:

$$e_o=\frac{K_1Z_{Q1}}{Z_{Q1}+Z_{Q2}}e_i$$

$$e'_o=K_2e_o=\frac{K_1K_2Z_{Q1}}{Z_{Q1}+Z_{Q2}}e_i$$

where $K_1$ and $K_2$ are constants.

By lowering the voltage $Vgc$, the portion of the input signal voltage $e_i$ to be divided by the transistor $Q_1$ is reduced, and thereby the attenuation factor of the output signal voltage $e_o$ at the junction $J_1$ and accordingly the value of the output signal voltage $e'_o$ of the emitter follower circuit in the transistor $Q_3$ is made large. In order to control efficiently the impedances of the transistors $Q_1$ and $Q_2$ in a complementary manner, it is desirable to design the circuit so that the potential difference between the base potential $V_{B1}$ of the transistor $Q_1$ and the collector potential $V_{C2}$ of the transistor $Q_2$, i.e. $V_{C2}-V_{B1}$, is below 0.7 v. at the time when the direct current source is applied without an input of alternating current. As for the case wherein the said potential difference is made smaller, it is possible to control the sum of the impedances almost fixedly and then to obtain the attenuation characteristics of the linearity by having the transistors $Q_1$ and $Q_2$ operate in the saturation region at the same time.

Figure 2:
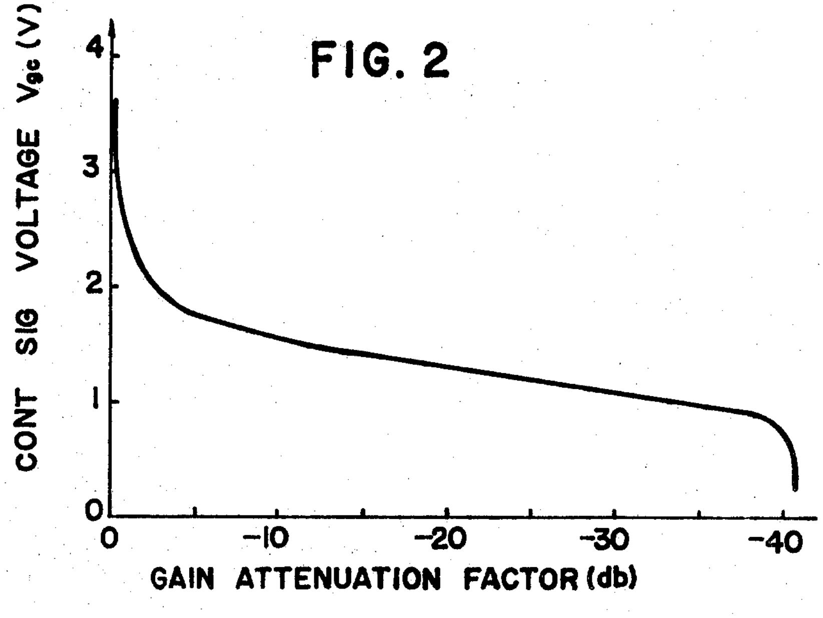
FIG. 2 shows a characteristic curve of control signal voltage ($Vgc$) vs. gain attenuation factor for a gain control circuit according to the invention.

FIG. 2 shows the control signal voltage $Vgc$ versus the gain attenuation factor GR, defined as $$20\log\frac{e_i}{e'_o}$$

of the gain control circuit, whose signal frequency is set at $f=58$ mHz., according to the present invention. As confirmed by the characteristic curve in FIG. 2, it is possible to make the attenuation factor GR higher as the control signal voltage $Vgc$ is lowered and to obtain the maximum attenuation factor of about −40 db. In cases where it is desired to obtain a high attenuation factor, the transistor $Q_1$ is made to operate in the saturation region and the transistor $Q_2$ operates in the active region as a result.

Figure 3:
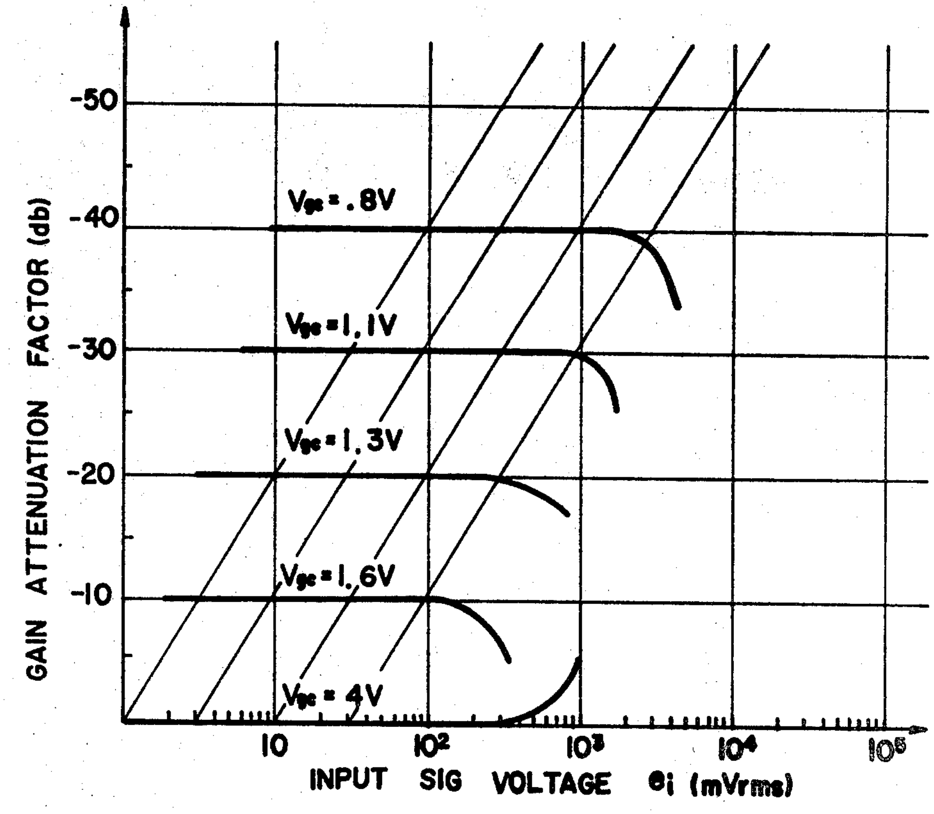
FIG. 3 shows a characteristic curve of gain attenuation factor vs. input signal voltage ($e_i$) for a gain control circuit according to the invention.

FIG. 3 shows the input signal voltage $e_i$, $f=58$ mHz., versus the gain attenuation factor with the control signal voltage GR as a parameter according to the present invention. As confirmed by the related characteristic curves, the input signal voltage $e_i$ is permissible up to about 1 v. RMS (root mean square), and it is possible to obtain the maximum output signal voltage $e'_o$ of about 30 mv. RMS. In contrast to the prior art arrangements wherein the allowable maximum input signal voltage using the nonlinear attenuation characteristics is about 10 mv. RMS, it can be seen that the allowable maximum input signal voltage has been remarkably improved in the present invention.

As stated above, according to the present invention, it is possible to obtain a large gain attenuation factor by complementary control of the impedances of two transistors and to obtain linear attenuation characteristics as well as to set up a high allowable input signal voltage.

Also, according to the invention, since the impedances of the two transistors $Q_1$ and $Q_2$ are controlled in a complementary manner, the input impedance $Z_i$ of the control circuit seen at the input signal terminals $i$ and $i'$, referring to FIG. 1, is almost fixed, so that it is possible to control the gain without undesirable influence upon the band characteristics in the tuning circuit of $L_1$ and $C_1$ annexed to the input signal source circuit, and thus the gain control circuit according to the present invention is suitable for application to the automatic gain control circuit of a high frequency amplification device with selection characteristics.

Moreover, because the gain control circuit of the invention is constituted by the direct coupling of the transistors, resistances, and diodes, it is possible to unify the part within the broken line 4 shown in FIG. 1 into one semiconductor body by the semiconductor integrated circuit technique, and the present invention is suitable for being provided as a semiconductor integrated circuit device.

While the invention has been specifically shown and described with reference to preferred embodiments thereof, it will be understood by those skilled in the art that the changes and modifications may be made therein without departing from the spirit and scope of the invention as obvious to one or ordinary skill in the art.

What is claimed is:

1. A gain control circuit comprising first and second transistors forming a series circuit by connection of the collector of said first transistor to the emitter of said second transistor, input signal terminals connected to an input signal source, said series circuit being connected across said input signal terminals, a first constant voltage means connected between the base and emitter of said first transistor for setting the potential of the base of said first transistor to a first substantially fixed potential and a second constant voltage means supplying a second substantially fixed potential connected between the base of said first transistor and the collector of said second transistor, a control signal source connected to the base of said second transistor, and an output load circuit connected to the junction of the collector of said first transistor and the emitter of said second transistor.

2. A gain control circuit as defined in claim 1, wherein said second constant voltage means includes a first diode connected to a bias voltage source and said first constant voltage means includes second and third diodes connected in series with said first diode.

3. A gain control circuit as defined in claim 2 wherein said output load circuit includes a third transistor connected in common emitter configuration between said bias voltage source and ground, the base of said third transistor being connected to the junction of the collector of said first transistor and the emitter of said second transistor.

4. A gain control circuit as defined in claim 3 wherein said input signal source is connected to said input signal terminals via a transformer, the emitter of said first transistor is connected to ground via a bias resistor, and the ends of said first diode being connected to ground via respective capacitors.

5. A gain control circuit comprising first and second transistors forming a series circuit by connection of the collector of said first transistor to the emitter of said second transistor, input signal terminals connected to an input signal source, said series circuit being connected across said input signal terminals, a constant voltage means for setting the potential of the base of said first transistor to a substantially fixed potential, and a control signal means connected to the base of said second transistor for varying the direct current voltage of the base of said second transistor, whereby the operating conditions of said first and second transistors are selectively controlled to vary the impedance thereof in a complementary manner, such that one of said transistors is in a low impedance state and the other is in a high impedance state.

6. A gain control circuit as defined in claim 5, wherein said constant voltage means includes first and second diodes connected between the base and emitter of said first transistor and a third diode connected between the base of said first transistor and the collector of said second transistor.

7. A gain control circuit as defined in claim 5 wherein said constant voltage means biases said first and second transistors such that the difference between the voltage level of the base of said first transistor and the voltage level of the collector of said second transistor is substantially equal to the voltage drop between the base and emitter of said second transistor.

References Cited

UNITED STATES PATENTS

| | | | |
|---|---|---|---|
| 3,229,218 | 1/1966 | Sickles et al. | 330—145X |
| 3,370,243 | 2/1968 | Vollmer | 330—145X |
| 3,431,506 | 3/1969 | Hirshfield et al. | 330—29X |

ROY LAKE, Primary Examiner

J. B. MULLINS, Assistant Examiner

U.S. Cl. X.R.

330—145